United States Patent
Fujita et al.

(10) Patent No.: US 7,598,532 B2
(45) Date of Patent: Oct. 6, 2009

(54) LIGHT-EMITTING DIODE

(75) Inventors: Yusuke Fujita, Higashihiroshima (JP); Masahiro Konishi, Ikoma (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 161 days.

(21) Appl. No.: 11/400,664

(22) Filed: Apr. 7, 2006

(65) Prior Publication Data

US 2006/0226437 A1 Oct. 12, 2006

(30) Foreign Application Priority Data

Apr. 8, 2005 (JP) .............................. 2005-112292

(51) Int. Cl.
*H01L 33/00* (2006.01)
(52) U.S. Cl. ............................ 257/98; 257/99; 257/100; 257/E33.059; 257/E33.061; 257/E33.072
(58) Field of Classification Search ................... 257/98, 257/99, 100, E33.058, E33.059, E33.061, 257/E33.072
See application file for complete search history.

(56) References Cited

U.S. PATENT DOCUMENTS

| | | | |
|---|---|---|---|
| 4,742,432 A | | 5/1988 | Thillays et al. |
| 4,907,044 A | * | 3/1990 | Schellhorn et al. ............. 257/98 |
| 5,331,512 A | | 7/1994 | Orton |
| 6,274,924 B1 | | 8/2001 | Carey et al. |
| 6,301,035 B1 | | 10/2001 | Schairer |
| 6,534,799 B1 | | 3/2003 | Wang et al. |
| 6,686,609 B1 | | 2/2004 | Sung |
| 6,707,069 B2 | | 3/2004 | Song et al. |
| 6,747,293 B2 | * | 6/2004 | Nitta et al. ...................... 257/99 |
| 2002/0145152 A1 | | 10/2002 | Shimomura |
| 2002/0190262 A1 | | 12/2002 | Nitta et al. |
| 2004/0056265 A1 | | 3/2004 | Arndt et al. |
| 2004/0065894 A1 | | 4/2004 | Hashimoto et al. |
| 2004/0201987 A1 | | 10/2004 | Omata |
| 2004/0211970 A1 | * | 10/2004 | Hayashimoto et al. ........ 257/98 |
| 2005/0133939 A1 | | 6/2005 | Chikugawa et al. |

FOREIGN PATENT DOCUMENTS

| | | |
|---|---|---|
| CN | 1466782 A | 1/2004 |
| CN | 1538538 A | 10/2004 |
| JP | 51-124388 A | 10/1976 |

(Continued)

OTHER PUBLICATIONS

Chinese Office Action dated Jun. 8, 2007, directed to counterpart CN Application No. 200610073239.7, (20 pages).

(Continued)

*Primary Examiner*—Victor A Mandala
(74) *Attorney, Agent, or Firm*—Morrison & Foerster LLP

(57) ABSTRACT

A light-emitting diode includes a substrate having a main surface, a light-emitting diode device arranged on the main surface, a translucent sealing resin portion sealing the light-emitting diode device so that the light-emitting diode device is implemented as an independent convex portion projecting from the main surface, and a reflector arranged on the main surface so as to surround an outer perimeter of the sealing resin portion with an inclined surface at a distance from the outer perimeter.

13 Claims, 13 Drawing Sheets

FOREIGN PATENT DOCUMENTS

| | | |
|---|---|---|
| JP | 63-22760 | 2/1988 |
| JP | 11-040859 A | 2/1999 |
| JP | 11-46018 | 2/1999 |
| JP | 11-087780 A | 3/1999 |
| JP | 2000-58924 | 2/2000 |
| JP | 2000-77725 | 3/2000 |
| JP | 2000-216443 | 8/2000 |
| JP | 2000-294838 A | 10/2000 |
| JP | 2002-222998 | 8/2002 |
| JP | 2002-314139 A | 10/2002 |
| JP | 2002-314143 A | 10/2002 |
| JP | 2003-197974 | 7/2003 |
| JP | 2004-311917 A | 11/2004 |
| JP | 2004-327955 A | 11/2004 |
| JP | 2005-175389 A | 6/2005 |
| JP | 2005-183531 | 7/2005 |
| JP | 2006-165138 | 6/2006 |
| KR | 2002-0079516 | 10/2002 |
| KR | 10-2004-0092512 | 11/2004 |
| WO | WO-02/05351 A1 | 1/2002 |

OTHER PUBLICATIONS

Extended European Search Report mailed on Aug. 14, 2006 for European Patent Application No. 06007421.8, 4 pages.

* cited by examiner

LIGHT-EMITTING DIODE

This nonprovisional application is based on Japanese Patent Application No. 2005-112292 filed with the Japan Patent Office on Apr. 8, 2005, the entire contents of which are hereby incorporated by reference.

FIELD OF THE INVENTION

The present invention relates to a light-emitting diode, and more particularly to a surface-mount, top-firing light-emitting diode suitable for a flashlight or various indicators in a portable information terminal and the like.

DESCRIPTION OF THE BACKGROUND ART

Japanese Patent Laying-Open No. 11-087780 discloses an exemplary conventional surface-mount, top-firing light-emitting diode. Description of this light-emitting diode will be given below.

For example, as shown in FIG. 27, a light-emitting diode 100 has such a structure that a light-emitting diode device 16 is arranged on a bottom surface of a recessed portion 1r in an inverted frustum shape, which is recessed from an upper surface of an opaque reflection case 1, and recessed portion 1r is completely filled with a translucent sealing resin portion 8 so as to seal the light-emitting diode device. Two metal pad portions 3a, 3b are provided on the bottom surface of the recessed portion. Light-emitting diode device 16 is mounted on the surface of metal pad portion 3a, while it is bonded to metal pad portion 3b via a gold wire 7 extending from the upper surface of the same. Two metal pad portions 3a, 3b are electrically connected to two terminal electrode portions 2a, 2b provided outside the opaque reflection case 1, respectively.

For example, Japanese Patent Laying-Open Nos. 2004-327955 and 2000-294838 describe other exemplary conventional surface-mount, top-firing light-emitting diodes.

In recent years, a surface-mount, top-firing white light-emitting diode or a surface-mount, top-firing light-emitting diode illuminating in multiple colors by combination of red, green and blue has been used for a flashlight or a reception indicator light in a portable terminal. For use in the portable terminal, a light-emitting diode capable of achieving not only brightness but also illumination in various colors has been necessary.

A material attaining a scattering effect is generally used for opaque reflection case 1 described above. In such a case, though an angle of beam spread is wide, it is difficult to obtain a light-emitting diode of high luminance.

SUMMARY OF THE INVENTION

An object of the present invention is to provide a light-emitting diode achieving high luminance and narrow directivity to such an extent that the light-emitting diode can be used for a flashlight of a portable terminal.

In order to achieve the object above, the light-emitting diode according to the present invention includes a substrate having a main surface, a light-emitting diode device arranged on the main surface, a metal line arranged to electrically connect the light-emitting diode device and the main surface to each other, a translucent sealing resin portion sealing the light-emitting diode device and the metal line so that the light-emitting diode device and the metal line are implemented as an independent convex portion projecting from the main surface, and a reflector arranged on the main surface so as to surround an outer perimeter of the sealing resin portion with an inclined surface at a distance from the outer perimeter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
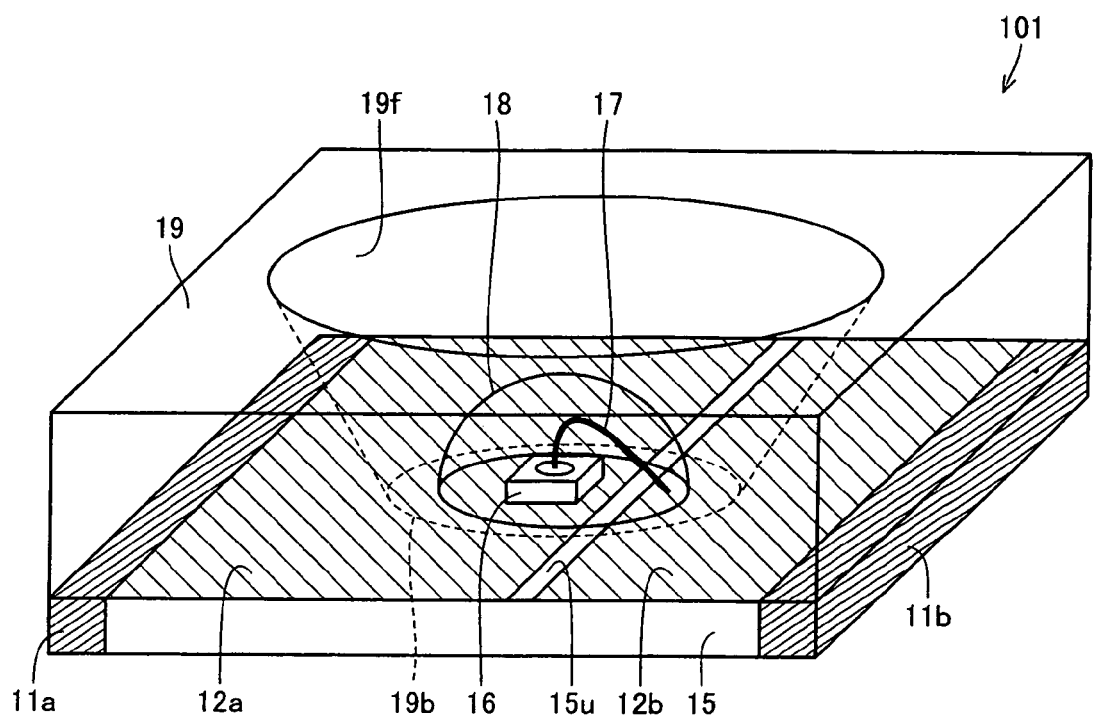
FIG. 1 is a perspective view of a light-emitting diode according to Embodiment 1 of the present invention.
Figure 2:
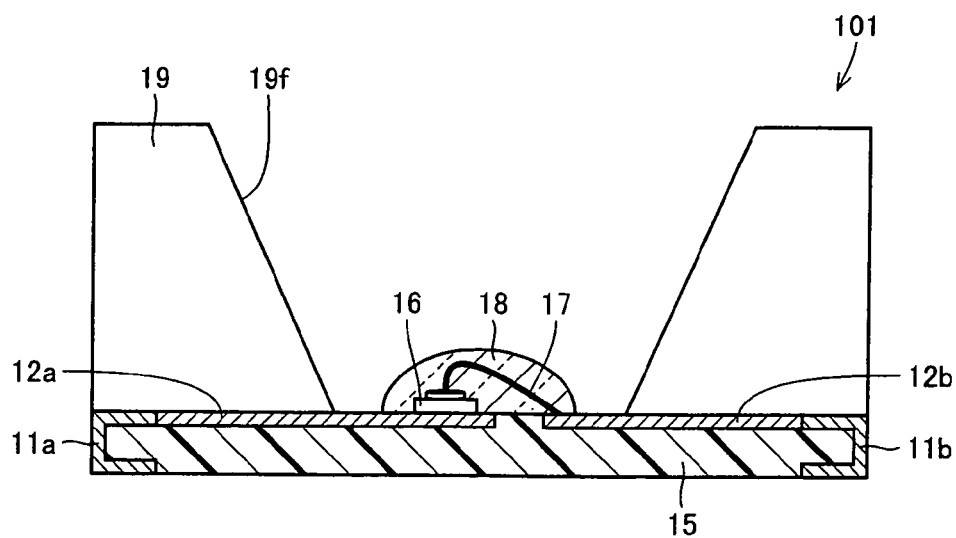
FIG. 2 is a cross-sectional view of the light-emitting diode according to Embodiment 1 of the present invention.

A light-emitting diode according to Embodiment 1 of the present invention will be described with reference to FIGS. 1 and 2. FIGS. 1 and 2 show a perspective view and a cross-sectional view of a light-emitting diode 101, respectively. Light-emitting diode 101 includes a substrate 15 having a main surface 15$u$, a light-emitting diode device 16 arranged on main surface 15$u$, a metal line 17 arranged to electrically connect light-emitting diode device 16 and main surface 15$u$ to each other, a translucent sealing resin portion 18 sealing light-emitting diode device 16 and metal line 17 so that light-emitting diode device 16 and metal line 17 are implemented as an independent convex portion projecting from main surface 15$u$, and a reflector 19 arranged on main surface 15$u$ so as to surround an outer perimeter of sealing resin portion 18 with an inclined surface 19$f$ at a distance from the outer perimeter. Substrate 15 is in a rectangular shape, and terminal electrode portions 11$a$, 11$b$ are provided on opposing two sides of substrate 15. Main surface 15$u$ serves as the upper surface of substrate 15 in FIG. 1, and metal pad portions 12$a$, 12$b$ are arranged on main surface 15$u$. Metal pad portions 12$a$, 12$b$ are both implemented by metal thin films, and cover different regions on main surface 15$u$, with a gap lying therebetween. Terminal electrode portion 11$a$ is electrically connected to metal pad portion 12$a$, while terminal electrode portion 11$b$ is electrically connected to metal pad portion 12$b$.

The bottom portion of reflector 19 has a bottom surface opening portion 19$b$, and main surface 15$u$ and metal pad portions 12$a$, 12$b$ are exposed in bottom surface opening portion 19$b$. The lower surface of light-emitting diode device 16 is adhered to metal pad portion 12$a$ on main surface 15$u$ with a conductive adhesive. The upper surface of light-emitting diode device 16 and metal pad portion 12$b$ are electrically connected to each other through wire bonding using metal line 17. Metal line 17 is preferably implemented by a gold wire.

In manufacturing the light-emitting diode, light-emitting diode device 16 is adhered to substrate 15, bonding using metal line 17 is carried out, and reflector 19 is attached after sealing resin portion 18 is formed.

In the present embodiment, the sealing resin portion is provided not to completely fill the recessed portion of the reflector but to cover solely the light-emitting diode device and the metal line to be implemented as the independent convex portion. Therefore, a distance traveled by the light emitted from the light-emitting diode device for passing through the sealing resin portion becomes shorter, and loss of light is decreased accordingly. A quantity of light that is emitted to the outside is thus increased, and a light-emitting diode attaining luminance higher than in a conventional example can be obtained. In addition, as the amount of resin necessary for forming the sealing resin portion is smaller than in the conventional light-emitting diode, cost reduction can be achieved.

Though light-emitting diode device 16 has been described as having an electrode on each of the upper and lower surfaces in the present embodiment, a light-emitting diode device having two electrodes on one surface may be employed. If the light-emitting diode device is of a type having two electrodes on the upper surface, two metal lines are used to electrically connect the two electrodes on the upper surface to main surface 15$u$. In this case, the sealing resin portion should cover both of the two metal lines. A light-emitting diode device having two electrodes on the lower surface may also be employed, and in this case, bonding to main surface 15$u$ may be carried out with a solder ball or the like. Here, the structure can be such that no metal line appears on the upper side of the light-emitting diode device, and an amount of resin necessary for the sealing resin portion can be reduced.

Embodiment 2

Figure 3:
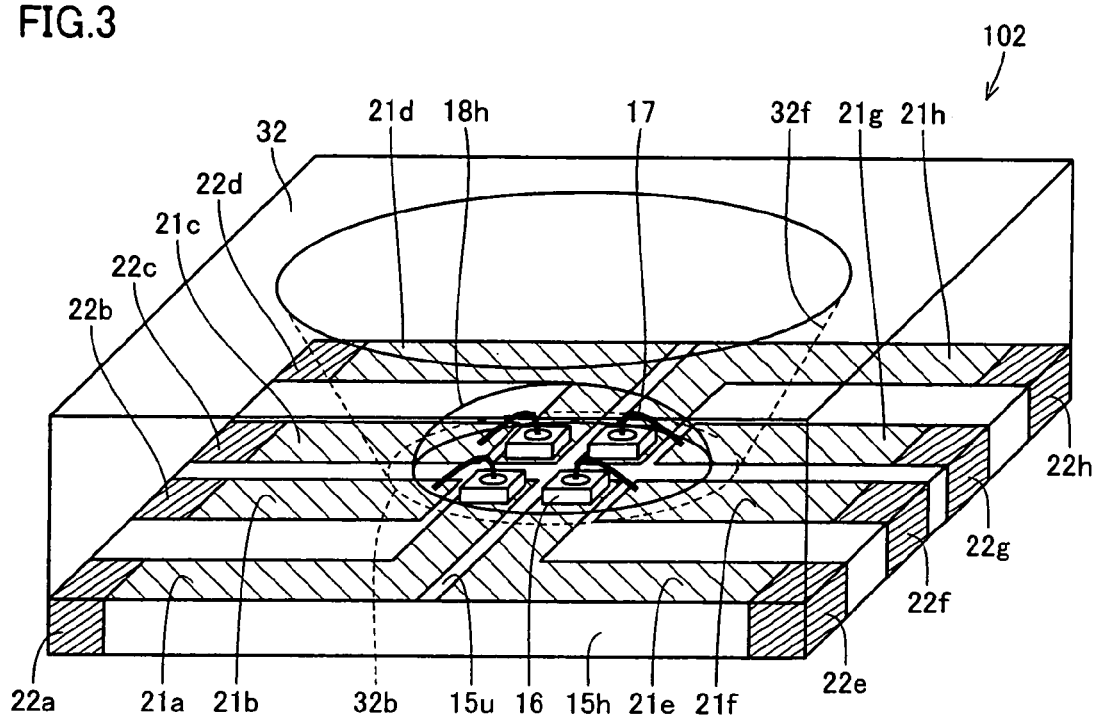
FIG. 3 is a perspective view of a light-emitting diode according to Embodiment 2 of the present invention.
Figure 4:
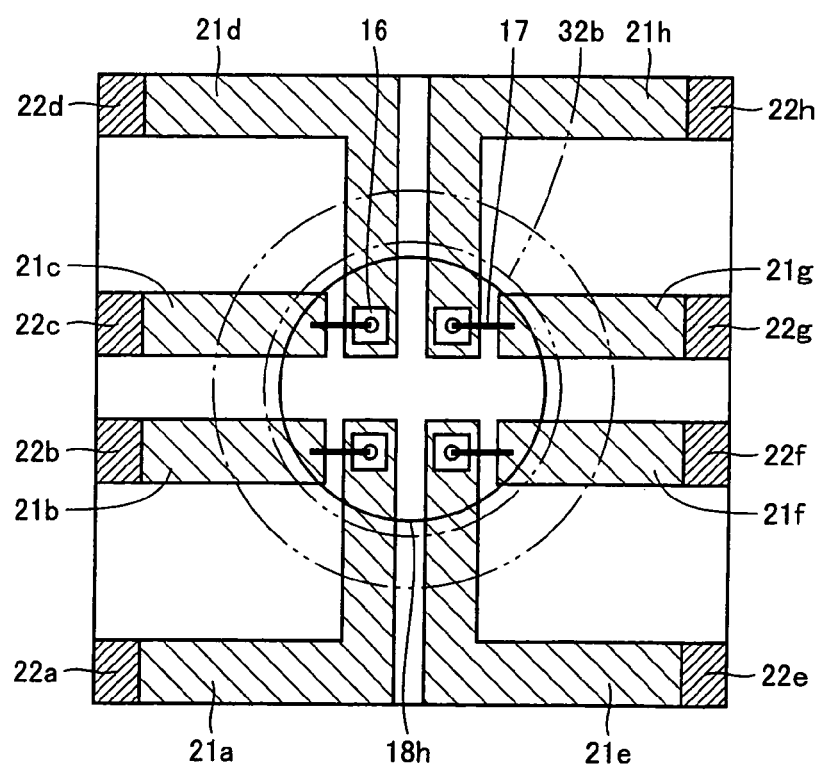
FIG. 4 is a plan view of the light-emitting diode according to Embodiment 2 of the present invention, in a state before a reflector is attached.

A light-emitting diode according to Embodiment 2 of the present invention will be described with reference to FIGS. 3 and 4. A light-emitting diode 102 is of a type implemented by collectively sealing a plurality of light-emitting diode devices 16 with a resin. FIG. 3 shows a perspective view of light-emitting diode 102, and FIG. 4 shows a plan view of the same in a state before the reflector is attached. FIG. 4 shows upper and lower contours of a through hole in the reflector with chain double dotted lines. As shown in FIG. 3, light-emitting diode 102 includes a substrate 15$h$ having main surface 15$u$, a plurality of light-emitting diode devices 16 arranged on main surface 15$u$, a plurality of metal lines 17 arranged to electrically connect the plurality of light-emitting diode devices 16 to main surface 15$u$ respectively, a translucent sealing resin portion 18$h$ collectively sealing the plurality of light-emitting diode devices 16 and the plurality of metal lines 17 so that the plurality of light-emitting diode devices 16 and the plurality of metal lines 17 are implemented as an independent convex portion projecting from main surface 15$u$, and a reflector 32 arranged on main surface 15$u$ so as to surround an outer perimeter of sealing resin portion 18$h$ with an inclined surface 32$f$ at a distance from the outer perimeter. As shown in FIG. 4, substrate 15$h$ includes terminal electrode portions as many as twice the number of light-emitting diode devices 16. Terminal electrode portions 22$a$, 22$b$, 22$c$, 22$d$, 22$e$, 22$f$, 22$g$, and 22$h$ are arranged in a distributed manner, along two opposing sides of substrate 15$h$. The number of the metal pad portions arranged on main surface 15$u$ of substrate 15$h$ is also twice the number of light-emitting diode devices 16. For example, metal pad portion 21$a$ is electrically connected to terminal electrode portion 22$a$, while metal pad portion 21$b$ is electrically connected to terminal electrode portion 22$b$.

In the present embodiment, as a plurality of light-emitting diode devices are provided, the light-emitting diode can attain higher luminance. In addition, in the present embodiment, each of the plurality of light-emitting diode devices 16 arranged within sealing resin portion 18$h$ is caused to illuminate in different color, so that a light-emitting diode illuminating in various colors can be obtained as a whole.

Embodiment 3

Figure 5:
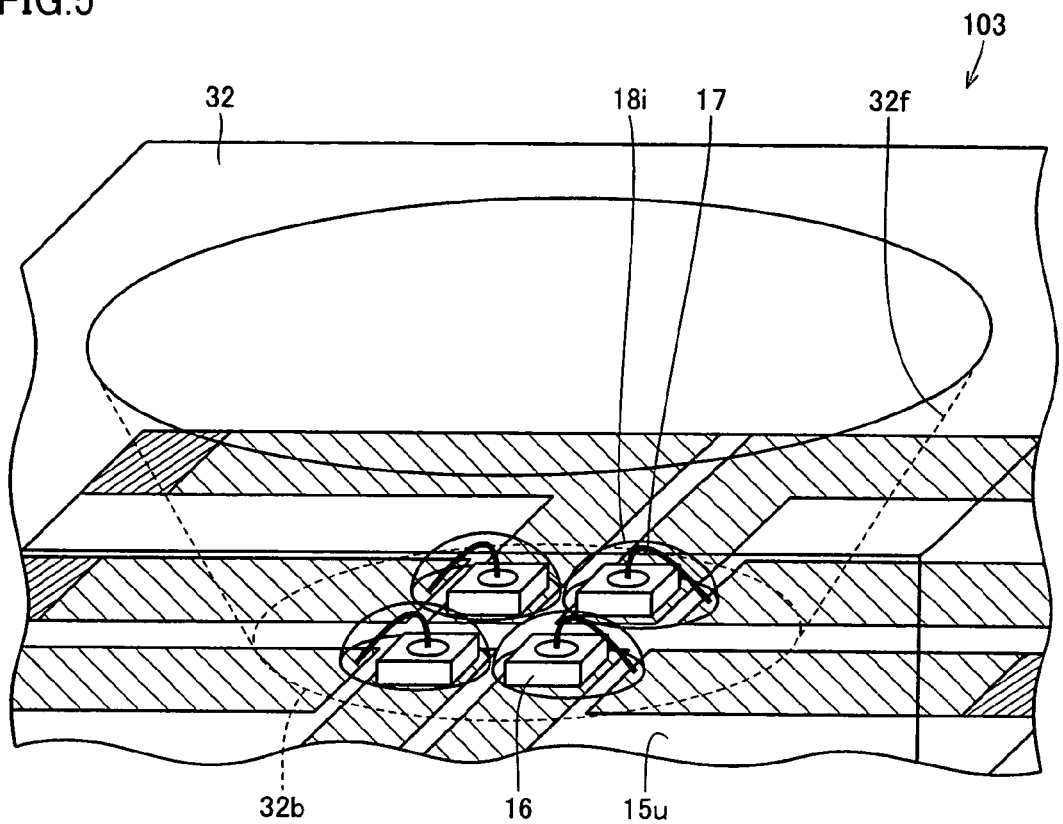
FIG. 5 is an enlarged perspective view of a central portion of a light-emitting diode according to Embodiment 3 of the present invention.
Figure 6:
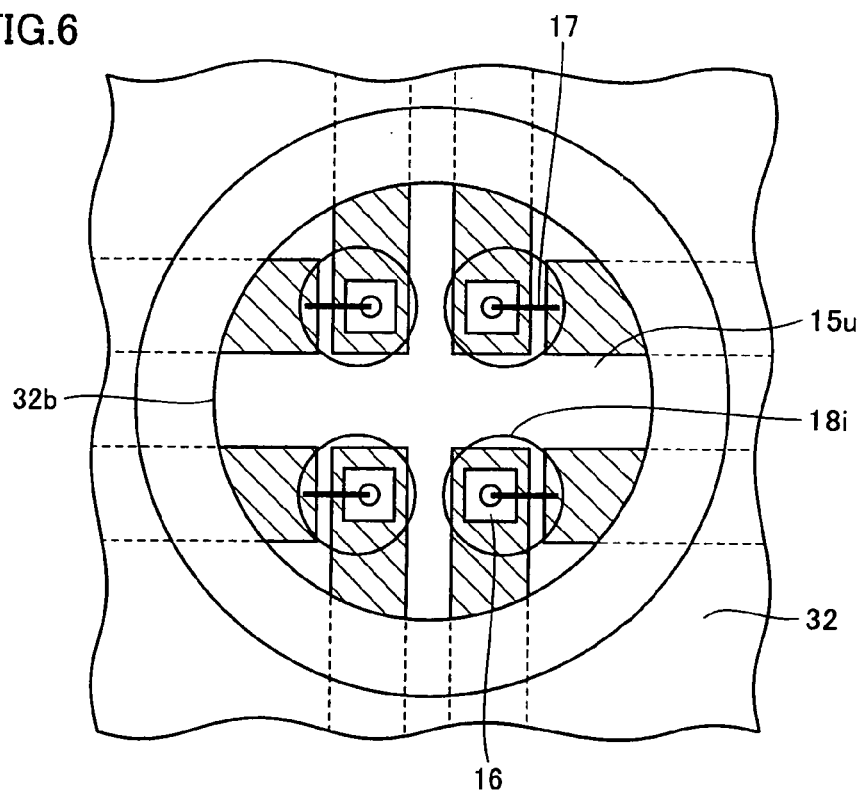
FIG. 6 is an enlarged plan view of the central portion of the light-emitting diode according to Embodiment 3 of the present invention.

A light-emitting diode according to Embodiment 3 of the present invention will be described with reference to FIGS. 5 and 6. A light-emitting diode 103 is of a type implemented by individually sealing a plurality of light-emitting diode devices 16 with a resin. FIGS. 5 and 6 show an enlarged perspective view and an enlarged plan view of a central portion of light-emitting diode 103, respectively. FIG. 6 shows a state after the reflector is attached. Light-emitting diode 103 includes a substrate having main surface 15$u$, a plurality of light-emitting diode devices 16 arranged on main surface 15$u$, a plurality of metal lines 17 arranged to electrically connect the plurality of light-emitting diode devices 16 to main surface 15$u$ respectively, a plurality of translucent sealing resin portions 18$i$ individually sealing respective sets of the plurality of light-emitting diode devices 16 and the plurality of metal lines 17 so that the respective sets of the plurality of light-emitting diode devices 16 and the plurality of metal lines 17 are implemented as independent convex portions projecting from main surface 15$u$, and reflector 32 arranged on main surface 15$u$ so as to surround outer perimeters of the plurality of sealing resin portions 18$i$ with inclined surface 32$f$ at a distance from the outer perimeters. The structure is otherwise basically the same as in Embodiment 2.

In the present embodiment, if a light-emitting diode device illuminating in different color is included among a plurality of light-emitting diode devices, a light-emitting diode illuminating in further various colors can be implemented, as compared with the light-emitting diode in which the light-emitting diode devices are collectively sealed with resin as in Embodiment 2. As individual sealing resin portions 18$i$ are provided, different types of resins can be selected for use, in accordance with a type of encapsulated light-emitting diode device 16. That is, the plurality of sealing resin portions 18$i$ in one light-emitting diode may be implemented by combination of sealing resin portions made of different materials. For example, a light-emitting diode device illuminating in red, green or blue is sealed with a transparent resin or a scatterer-containing resin, whereas a light-emitting diode device illuminating in blue or near-ultraviolet color may be sealed with a phosphor-containing resin. In this manner, variety of colors that can be expressed by the light-emitting diode is increased.

Embodiment 4

Figure 7:
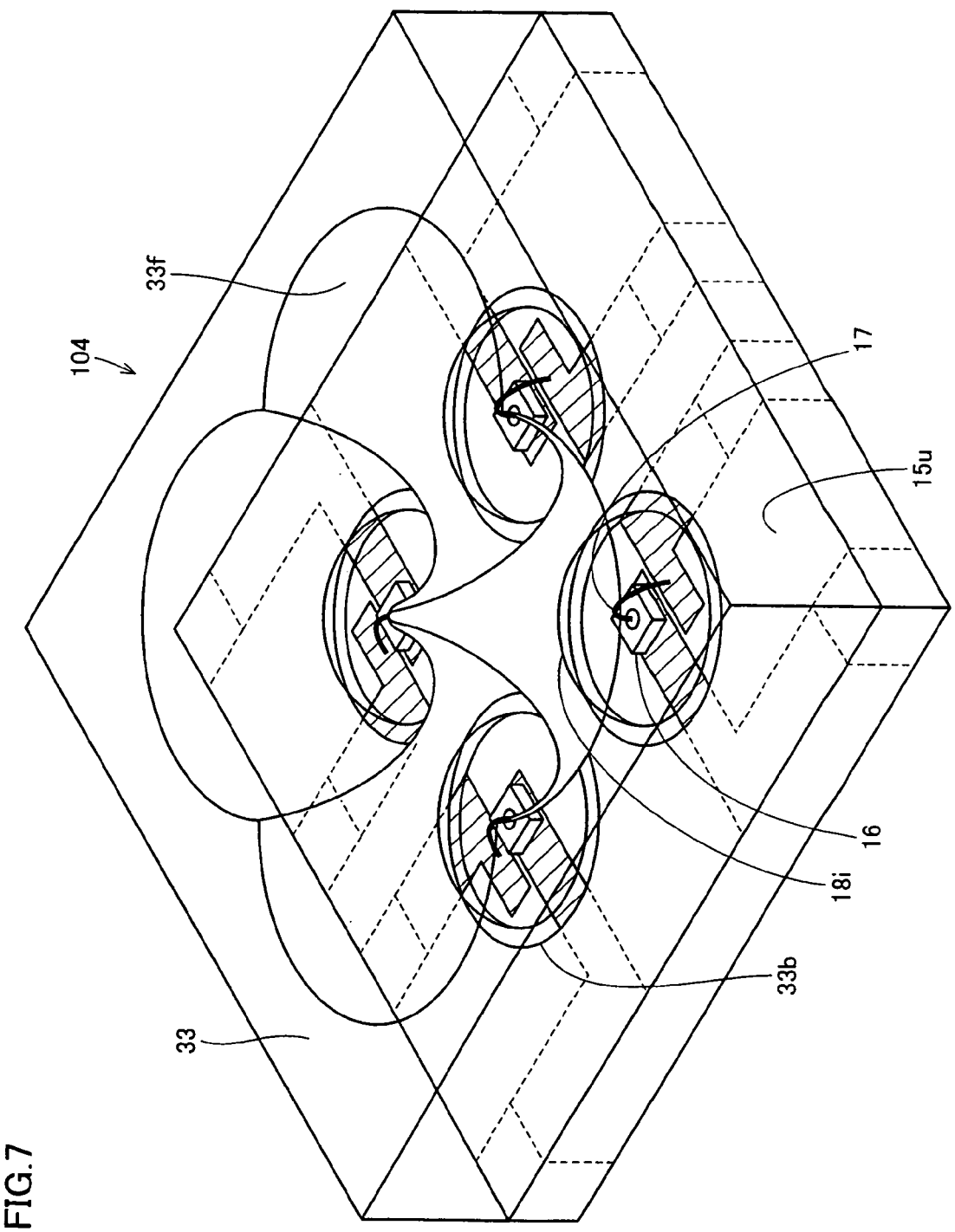
FIG. 7 is an enlarged perspective view of a central portion of a light-emitting diode according to Embodiment 4 of the present invention.
Figure 8:
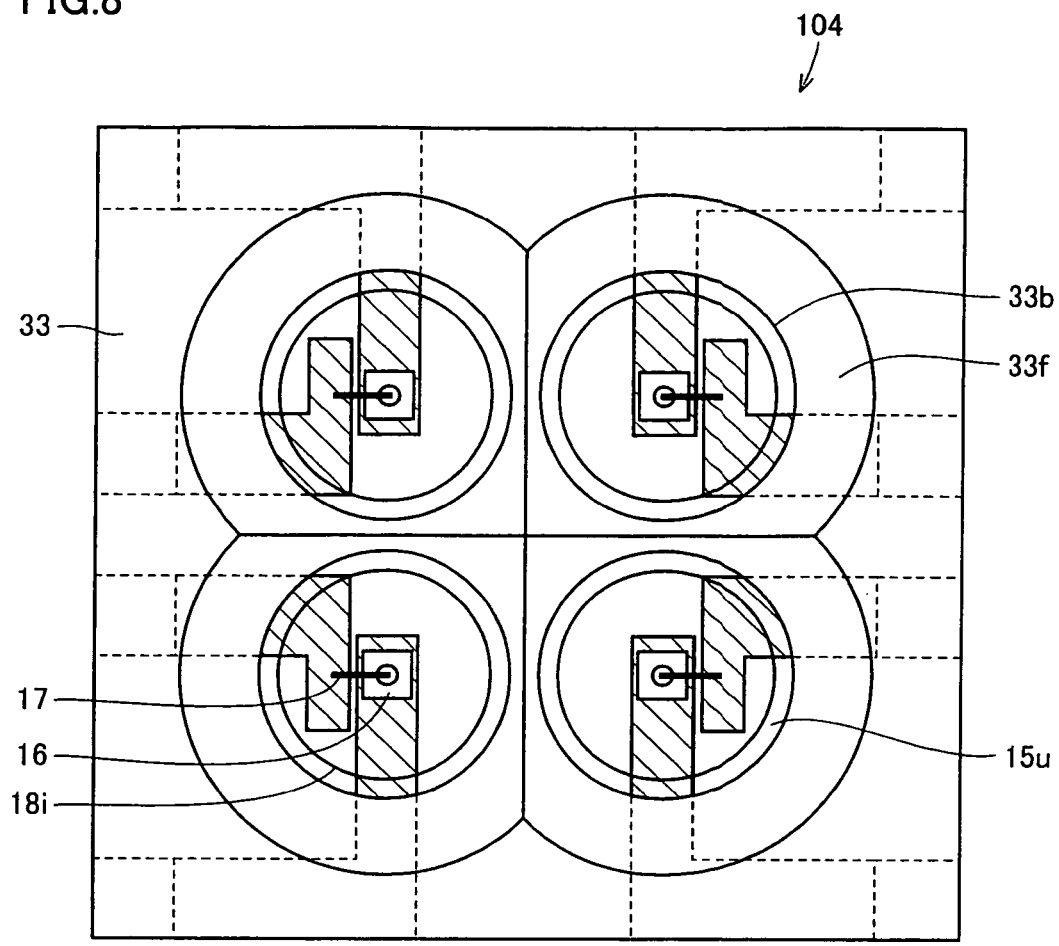
FIG. 8 is an enlarged plan view of the central portion of the light-emitting diode according to Embodiment 4 of the present invention.

A light-emitting diode according to Embodiment 4 of the present invention will be described with reference to FIGS. 7 and 8. A light-emitting diode 104 is of a type implemented by individually sealing a plurality of light-emitting diode devices 16 with a resin, as in Embodiment 3, however, Embodiment 4 is different from Embodiment 3 in the structure of the reflector. FIG. 7 shows an enlarged perspective view of a central portion of light-emitting diode 104, and FIG. 8 shows a plan view of light-emitting diode 104, in a state after the reflector is attached. Light-emitting diode 104 includes a reflector 33. Reflector 33 is arranged on main surface 15$u$ so as to surround an outer perimeter of each of the plurality of sealing resin portions 18$i$ with an inclined surface 33$f$ at a distance from the outer perimeter. The structure is otherwise basically the same as in Embodiment 3.

Though ridgelines on partitioning portions of reflector 33 crisscross in FIG. 8, actually, the vertex of a central, mountain-like portion is rounded as shown in FIG. 7. Therefore, the ridgelines may not be seen around the center in FIG. 8. The vertex of the central, mountain-like portion in FIG. 7 may be rounded, with a greater radius of curvature being set. Alternatively, a flat top surface may remain on the top of the central, mountain-like portion.

According to the structure of Embodiment 3, even if light-emitting diode devices 16 illuminating in different colors are arranged in combination, reflector 32 having a single, large recessed portion is arranged. In such a case, the colors are visually recognized in an unbalanced manner. In contrast, according to the present embodiment (Embodiment 4), individual sealing resin portion 18$i$ is individually surrounded by inclined surface 33$f$ of reflector 33 at a distance from the outer perimeter, and the degree of unbalance in visual recognition of colors can be mitigated. The present embodiment is particularly preferred in its high luminance and absence of unbalance in visual recognition of colors. As described in Embodiment 3, different types of resins may be used in combination as the plurality of sealing resin portions 18$i$.

Embodiments 1 to 4 show some examples of the surface-mount, top-firing light-emitting diodes. Here, the reflector used in these light-emitting diodes is broadly categorized into two structural types in terms of the shape. The shape of the reflector will be described in the following.

Figure 9:
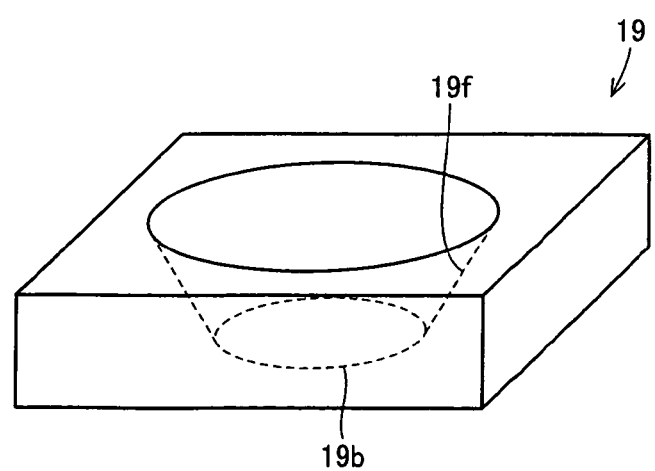
FIG. 9 is a perspective view of a reflector used in the light-emitting diode according to Embodiment 1 of the present invention.
Figure 10:
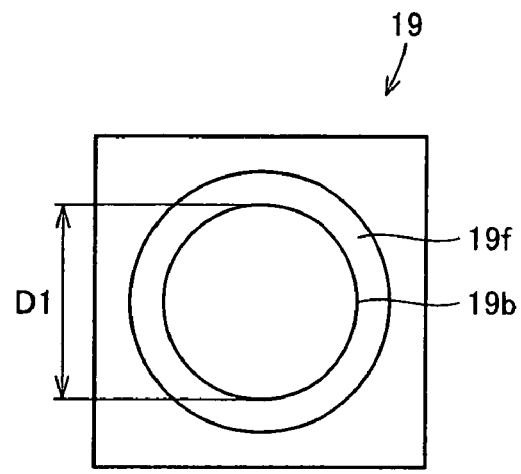
FIG. 10 is a plan view of the reflector used in the light-emitting diode according to Embodiment 1 of the present invention.

FIGS. 9 and 10 show a perspective view and a plan view of reflector 19 used in light-emitting diode 101 shown in Embodiment 1, respectively. The maximum value of a diameter D1 of bottom surface opening portion 19$b$ is defined by an inclination angle and a height of the reflector as well as by an outer dimension of the light-emitting diode. The minimum value of diameter D1 is defined by a chip dimension of the light-emitting diode device, a size necessary for wire bonding and the like. Preferably, diameter D1 is set to a value from at least 2.5 mm to at most 2.7 mm. The inclination angle of inclined surface 19$f$ serving as the reflection surface is set to 60 to 70°. Reflector 32 used in light-emitting diodes 102, 103 is also in a similar shape. Here, the "inclination angle" refers to an angle between the main surface of the substrate and the inclined surface when the reflector is attached to the substrate.

Figure 11:
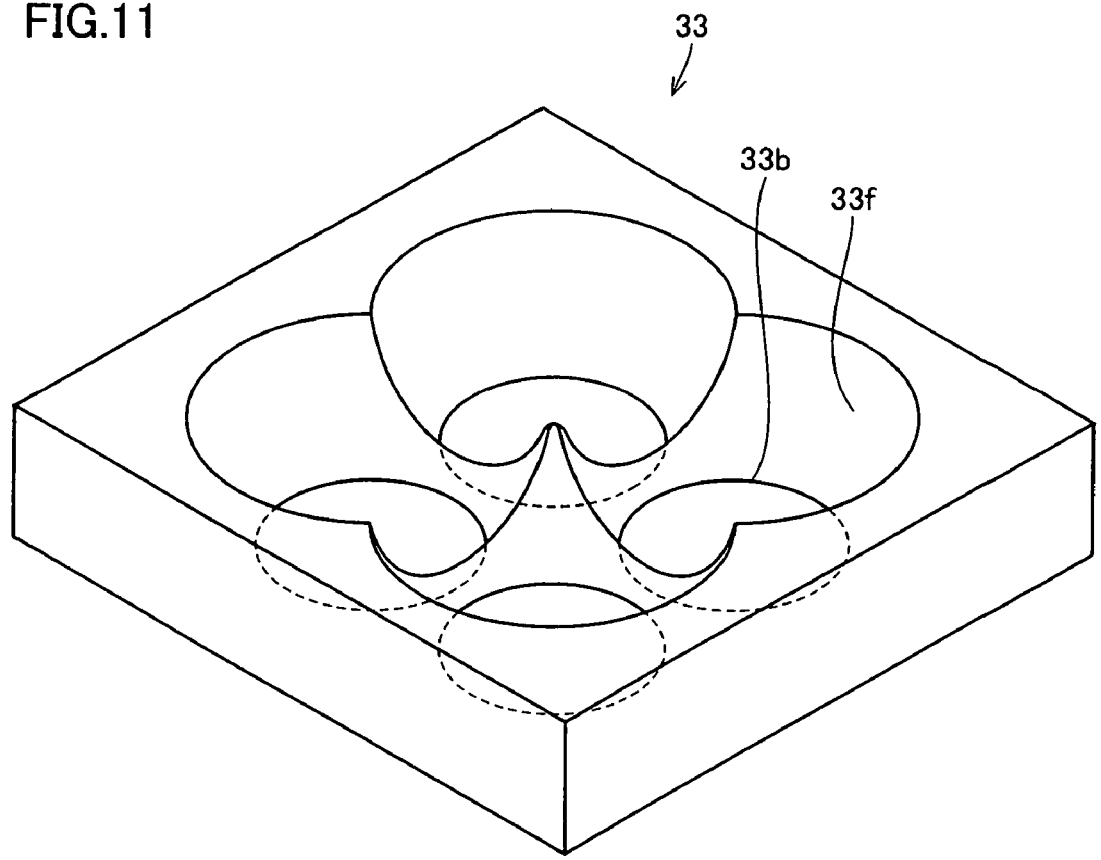
FIG. 11 is a perspective view of a reflector used in the light-emitting diode according to Embodiment 4 of the present invention.
Figure 12:
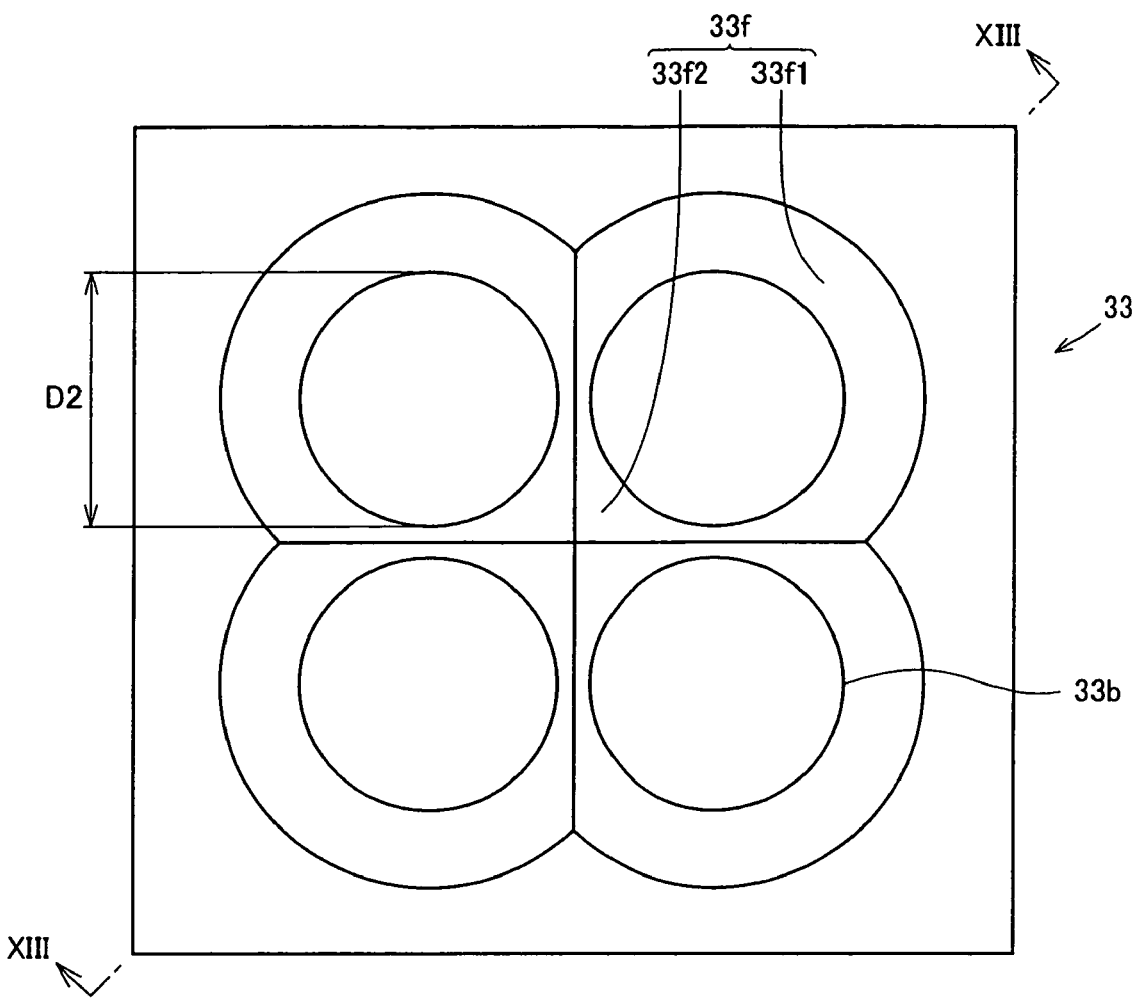
FIG. 12 is a plan view of the reflector used in the light-emitting diode according to Embodiment 4 of the present invention.
Figure 13:
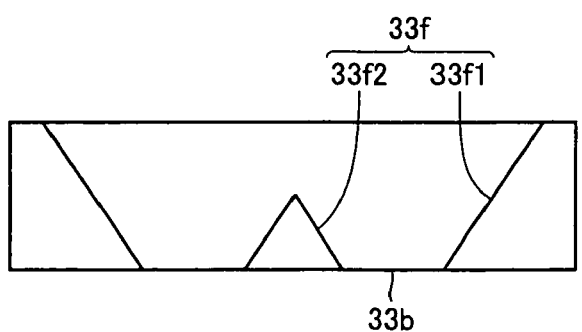
FIG. 13 is a cross-sectional view along the line XIII-XIII in FIG. 12.

FIGS. 11 and 12 show a perspective view and a plan view of reflector 33 used in light-emitting diode 104 shown in Embodiment 4, respectively. A diameter D2 of a bottom surface opening portion 33$b$ of reflector 33 corresponding to the individual light-emitting diode device is set to at most 2.7 mm. Inclined surface 33$f$ of reflector 33 is implemented by an outer reflection surface 33$f$1 and an inner reflection surface 33$f$2. FIG. 13 is a cross-sectional view along the line XIII-XIII in FIG. 12. The inclination angle of outer reflection surface 33$f$1 is set to 60 to 70°, while the inclination angle of inner reflection surface 33$f$2 is set to 55 to 70°.

Figure 14:
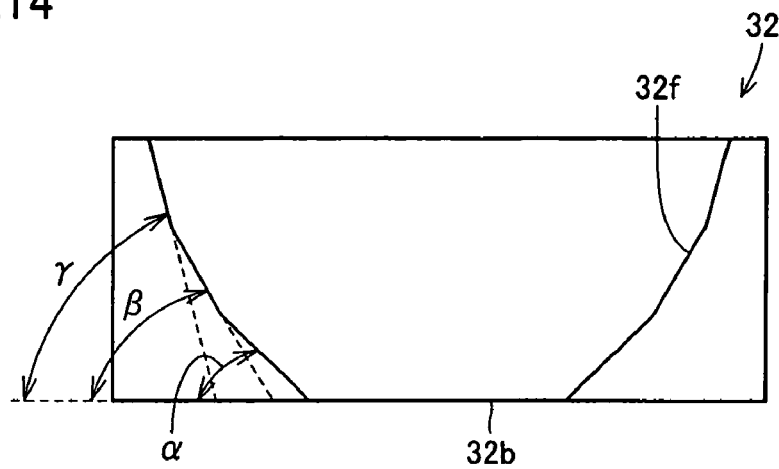
FIG. 14 is a first diagram showing a shape of the reflector according to the present invention.

The reflector described so far has the reflection surface of which inclination angle is constant. Regardless of whether there is/are provided a single light-emitting diode device or a plurality of light-emitting diode devices in one light-emitting diode, if the reflection surface surrounding the same has a constant inclination angle, the light-emitting diode tends to have a wide directivity characteristic. Here, the outer reflection surface of the reflector is implemented by combination of three gradients as shown in FIG. 14, so that a light-emitting diode attaining narrow directivity is obtained. Therefore, the light-emitting diode can have directivity suitable for the flashlight. FIG. 14 is a cross-sectional view of reflector 32 having one large bottom surface opening portion 32$b$, with the reflection surface having three gradients of inclination angles $\alpha$, $\beta$ and $\gamma$. Though FIG. 14 shows reflector 32, reflector 19 may be implemented in a similar manner.

Figure 15:
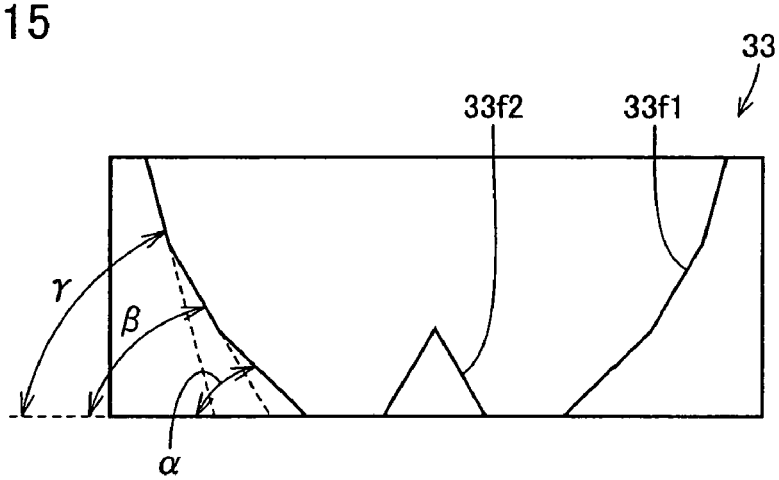
FIG. 15 is a second diagram showing a shape of the reflector according to the present invention.
Figure 16:
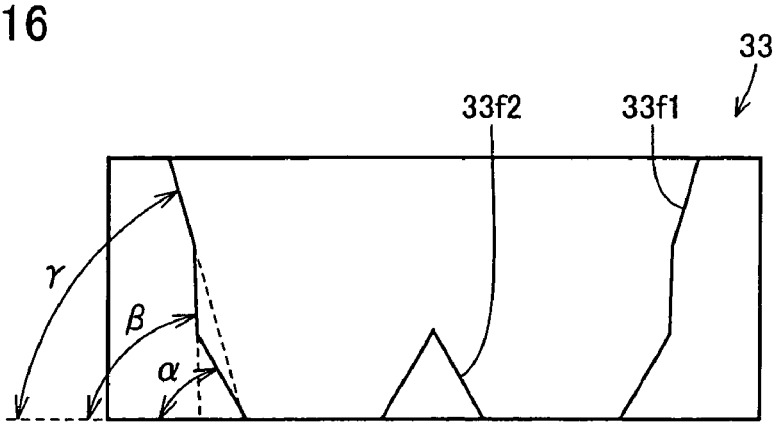
FIG. 16 is a third diagram showing a shape of the reflector according to the present invention.

FIG. 15 is a cross-sectional view of reflector 33 that individually surrounds light-emitting diode devices and has three gradients of inclination angles $\alpha$, $\beta$ and $\gamma$. As shown in FIG. 15, the gradient may be steeper as the distance from the light-emitting diode device is greater, that is, relation of $\alpha<\beta<\gamma$ may be established. Alternatively, as shown in FIG. 16, relation of $\alpha<\beta$, $\beta>\gamma$ may be established among the inclination angles, i.e., three gradients, of the outer reflection surface.

Figure 17:
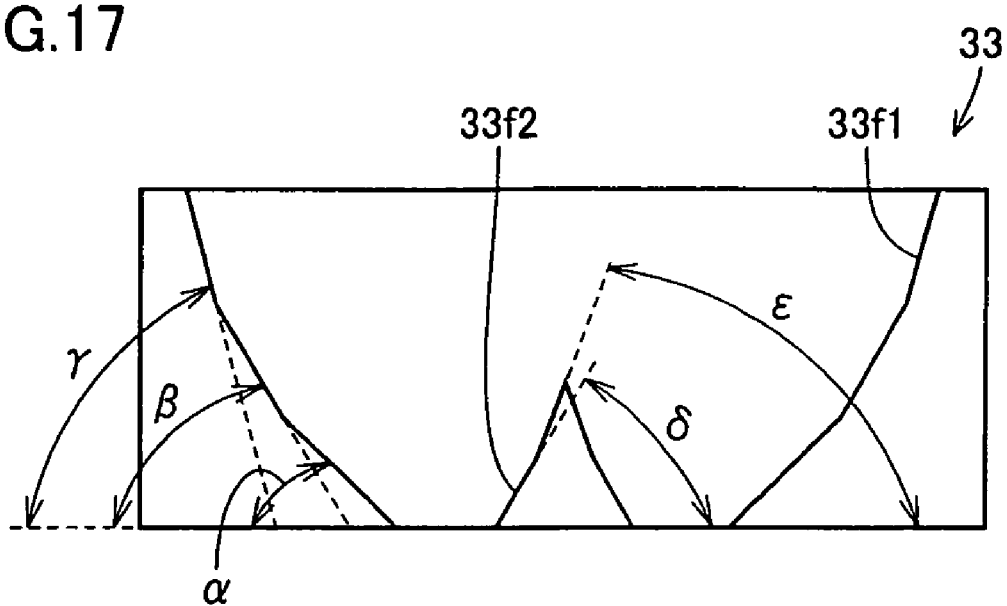
FIG. 17 is a fourth diagram showing a shape of the reflector according to the present invention.

Preferably, in reflector 33, outer reflection surface 33$f$1 has three gradients satisfying the relation of $\alpha<\beta<\gamma$ or three gradients satisfying the relation of $\alpha<\beta$, $\beta>\gamma$, whereas inner reflection surface 33*f*2 has an angle satisfying the relation of δ<ε as shown in FIG. 17. With such a shape, the structure of the reflector attaining narrow directivity can be obtained. In particular, if reflector 32 shown in FIG. 14 is used in light-emitting diode 102 shown in FIG. 3 and its inclination angle is set such that α=45°, β=60°, and γ=70°, the light-emitting diode attaining high luminance and narrow directivity can be obtained. Namely, the inclined surface is preferably implemented by sequential combination of three gradients of approximately 45°, approximately 60° and approximately 70°.

Figure 18:
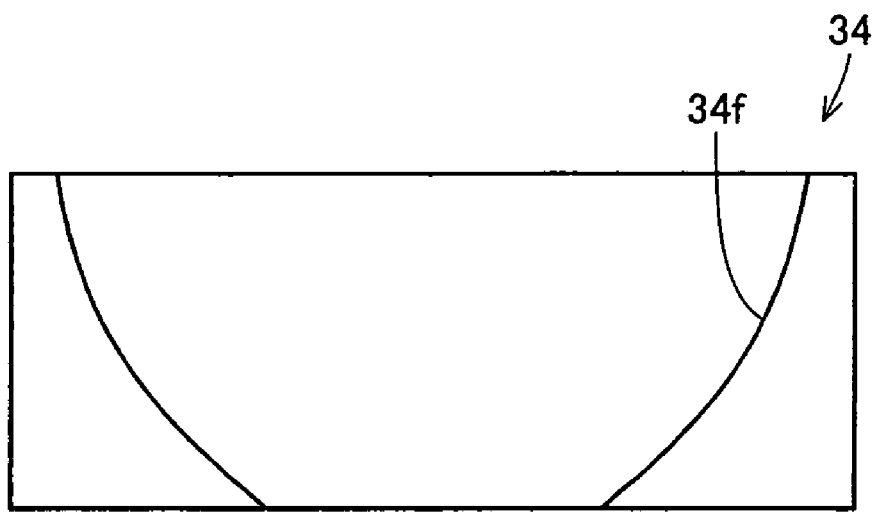
FIG. 18 is a fifth diagram showing a shape of the reflector according to the present invention.
Figure 19:
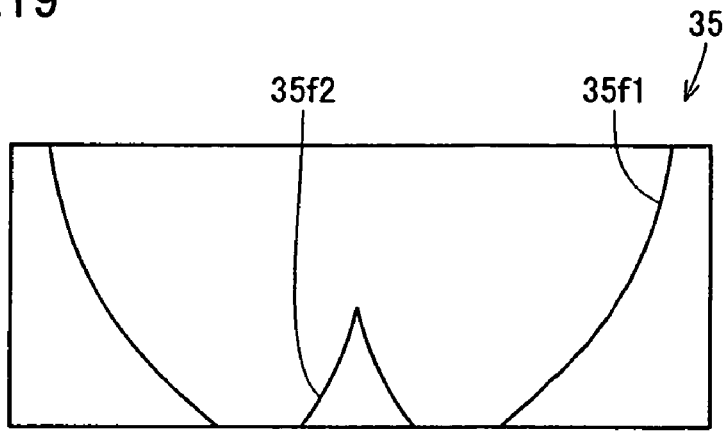
FIG. 19 is a sixth diagram showing a shape of the reflector according to the present invention.

Though the number of gradients may be set to 3 or more, preferably, the inclination angle is greater toward the top. If the number of gradients of the reflector is indefinitely increased, the reflector has cross-section in a substantially arc shape, as in the case of an inclined surface 34*f* of reflector 32 shown in FIG. 18, and such a shape may also be accepted. In other words, the inclined surface of the reflector may be in such a shape that its cross-section is in a substantially arc shape and the gradient is steeper as the distance from the main surface of the substrate is greater. This is applicable to both of the outer reflection surface and the inner reflection surface. Therefore, as in the case of a reflector 35 shown in FIG. 19, an outer reflection surface 35*f*1 and an inner reflection surface 35*f*2 may both have a substantially arc cross-sectional shape. In each embodiment described above, excellent characteristic can be obtained if the cross-sectional shape of the outer reflection surface or the inner reflection surface serving as the inclined surface is approximated by the arc having a radius of approximately 0.2 mm. When the surface-mount, top-firing light-emitting diode was fabricated with this reflector, a half-value angle $\theta_{1/2}$ attained to 35°.

As to a material for the reflector, generally, a material having a scattering effect is used. On the other hand, the use of such a material alone does not lead to implementation of a surface-mount, top-firing light-emitting diode attaining high luminance suitable for the flashlight. Accordingly, the reflector surface is subjected to mirror-finish treatment so as to improve reflectivity, whereby the surface-mount, top-firing light-emitting diode attaining high luminance suitable for the flashlight can be obtained. The mirror-finish treatment may be implemented by mirror-finish plating using aluminum or silver. The mirror-finish plating using such a material is preferable because particularly high luminance can be achieved. The entire surface of the reflector or solely the inner surface of the recessed portion of the reflector may be subjected to mirror-finish plating. If an effect of high luminance is achieved substantially similarly between the case of mirror-finish plating on the entire surface and the case of mirror-finish plating solely on the inner surface of the recessed portion of the reflector, solely the inner surface of the recessed portion is preferably subjected to mirror-finish plating, because of lower cost.

The sealing resin portion used in the light-emitting diode in each embodiment described above will be discussed. Types of resin used as a material for forming the sealing resin include a transparent resin, a scatterer-containing resin, and a phosphor-containing resin. Though there are light-emitting diode devices illuminating in various colors, the transparent resin and the scatterer-containing resin can be used for a light-emitting diode device illuminating in any color. On the other hand, the phosphor-containing resin can be used only for a blue or near-ultraviolet light-emitting diode. Though the type of the light-emitting diode device to which the phosphor-containing resin is adapted is limited, in the examples of light-emitting diodes 102, 103 and 104, all of four light-emitting diode devices 16 may be implemented by the blue to near-ultraviolet light-emitting diode devices and sealed by the phosphor-containing resin, thus implementing a light-emitting diode attaining high luminance.

Figure 20:
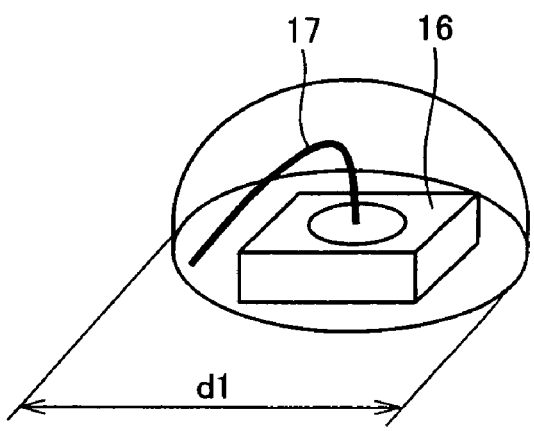
FIG. 20 is a first diagram showing a shape of a sealing resin portion according to the present invention.
Figure 21:
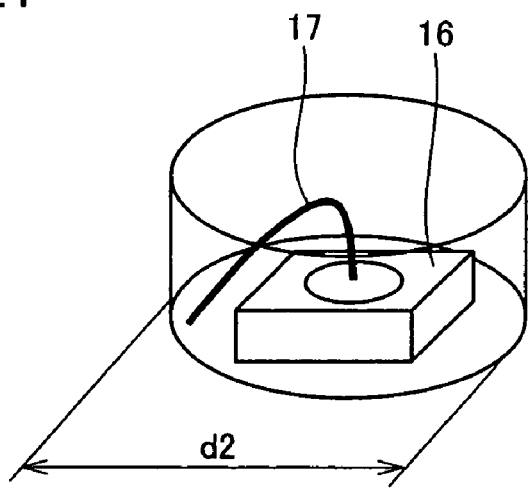
FIG. 21 is a second diagram showing a shape of the sealing resin portion according to the present invention.

In the embodiments described so far, a substantially hemispherical sealing resin portion as shown in FIG. 20 has been shown, however, the shape of the sealing resin portion is not limited as such. The sealing resin portion may be in a columnar shape as shown in FIG. 21. In addition, the sealing resin portion may be in a substantially columnar shape, without limited to exactly columnar shape. The sealing resin portion in a shape as shown in FIG. 21 can be formed in such a manner that a plate member for forming having a column-shaped opening portion is placed on the substrate, the resin is supplied into the opening portion and thereafter cured, and the plate member for forming is removed from the substrate. As a result of study by the inventors, it has been found that output of light is greater when there is a distance between the bottom surface of the sealing resin portion in FIG. 20 and the reflector than otherwise. This is the reason why the reflector is provided at a distance from the outer perimeter of the sealing resin portion in each embodiment described above. In the example studied by the inventors, it has been found that the output of light is maximum when diameter D1 of the bottom surface opening portion of the reflector is set to 2.5 mm and a diameter d1 of the bottom surface of the sealing resin portion is set to 2 mm. Whether the sealing resin portion is in a substantially hemispherical shape or in a columnar shape, a preferred condition for distance between an outer perimeter of the sealing resin portion and an inner perimeter of the bottom surface opening portion of the reflector is the same. This may be because a point of illumination of the light-emitting diode device is located close to the bottom surface, i.e., approximately 10 μm from the bottom surface. It is expected that, if the point of illumination is located as high as approximately 100 μm from the bottom surface, difference is produced depending on the shape of the sealing resin portion.

Preferably, a diameter d2 of the bottom surface of the sealing resin portion in FIG. 21 is also set to at most 2 mm. As a result of setting of such a size, the sealing resin portion suited to the reflector described above is implemented.

If the sealing resin portion is in a columnar shape as shown in FIG. 21, control of the outer diameter and the height is facilitated. It is preferable to ensure control of the outer diameter and the height. In particular, in order to improve reflection efficiency, a predetermined distance is preferably placed between the reflector and the sealing resin portion so as to avoid interference between the inner perimeter of the reflector and the sealing resin portion. In order to meet such demand, the sealing resin portion in a columnar shape as shown in FIG. 21 is preferred to the sealing resin portion in a shape as shown in FIG. 20 obtained by dropping the resin, because the outer diameter is more readily controlled to a dimension not larger than a predetermined value.

Embodiment 5

Figure 22:
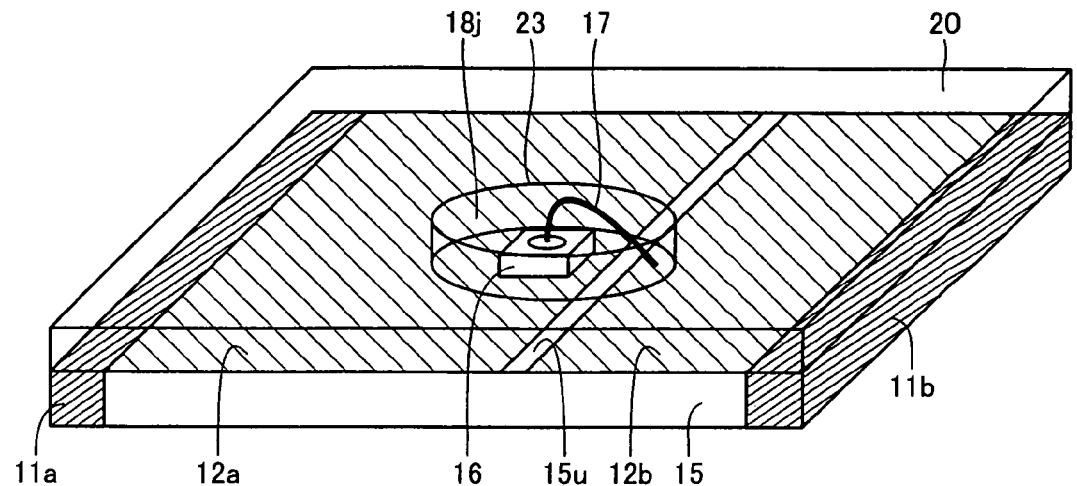
FIG. 22 is a perspective view of a light-emitting diode according to Embodiment 5 of the present invention, which is being assembled.
Figure 23:
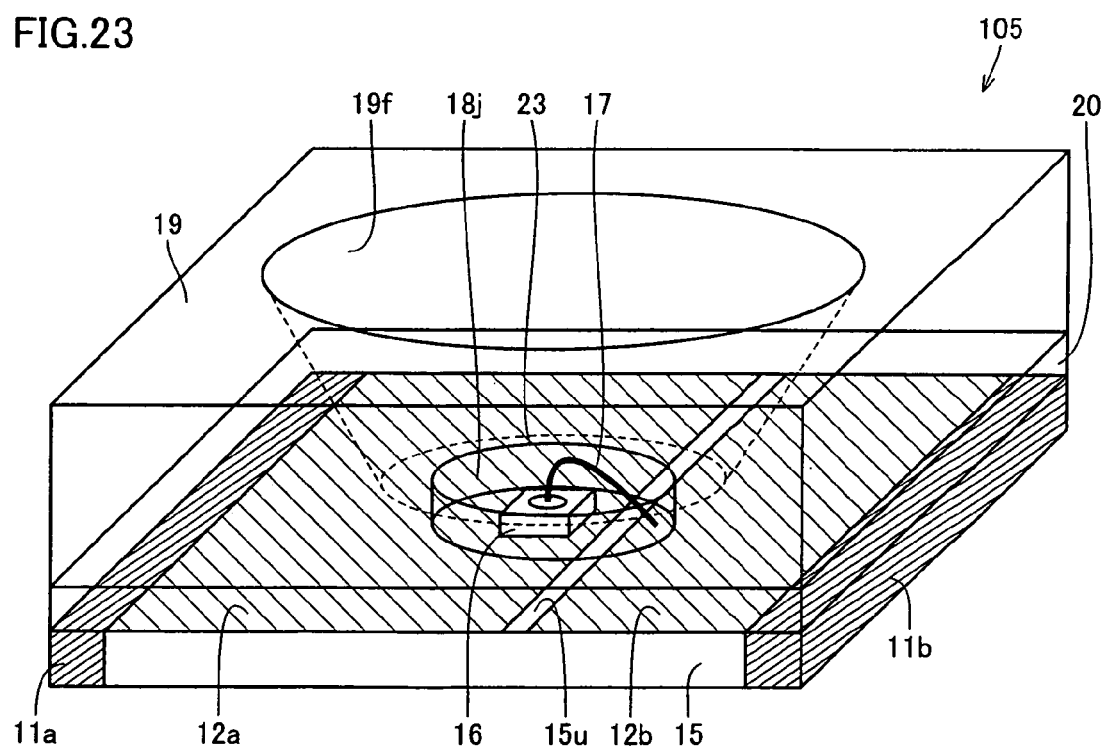
FIG. 23 is a perspective view of the light-emitting diode according to Embodiment 5 of the present invention.
Figure 24:
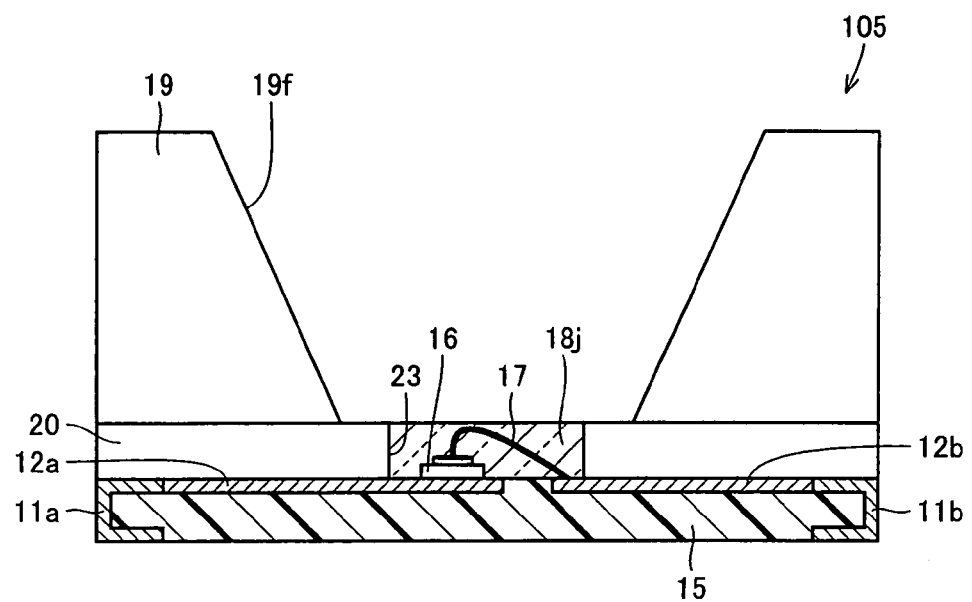
FIG. 24 is a cross-sectional view of the light-emitting diode according to Embodiment 5 of the present invention.

Further, as a variation of the sealing resin portion, a structure using a lamination portion may be possible. A light-emitting diode according to Embodiment 5 of the present invention will be described with reference to FIGS. 22 to 24. In assembling the light-emitting diode, initially as shown in FIG. 22, a plate member called a lamination portion 20 is laminated to substrate 15. Lamination portion 20 has a column-shaped opening portion 23. Lamination portion 20 is laminated to main surface 15*u* of substrate 15, so that main surface 15*u* of substrate 15 is exposed in opening portion 23. Light-emitting diode device 16 is arranged on main surface 15u exposed in opening portion 23. Though lamination of lamination portion 20 is performed first herein, arrangement of light-emitting diode device 16 may precede lamination of lamination portion 20, or vice versa. In this state, a translucent resin is supplied to fill the internal space in opening portion 23, thus sealing light-emitting diode device 16. A sealing resin portion 18j implemented by the translucent resin is thus formed. Thereafter, reflector 19 is arranged as shown in FIG. 23, and a light-emitting diode 105 is obtained. FIG. 24 shows a cross-section of light-emitting diode 105.

Light-emitting diode 105 includes substrate 15 having main surface 15u, lamination portion 20 laminated to substrate 15 and implemented by a plate member having opening portion 23 for exposing main surface 15u, light-emitting diode device 16 arranged on main surface 15u in opening portion 23, translucent sealing resin portion 18j sealing light-emitting diode device 16 in such a manner as filling the space in opening portion 23, and reflector 19 arranged on a surface of lamination portion 20 opposite to substrate 15, so as to surround an outer perimeter of opening portion 23 with inclined surface 19f at a distance from the outer perimeter.

In light-emitting diode 105 in the present embodiment, sealing resin portion 18j is formed by filling the space in opening portion 23 with the resin. Namely, sealing with resin is facilitated. In addition, as light emitted from light-emitting diode device 16 efficiently enters reflector 19, the light-emitting diode can attain narrower directivity. In light-emitting diode 105, light collection performance is improved, and half-value angle $\theta_{1/2}$ attains to 30°. Instead of reflector 19, a reflector of any type described so far may be used in this structure. The example of light-emitting diode 105 includes a single light-emitting diode device 16, however, a plurality of light-emitting diode devices may be mounted.

Though Embodiments 2 to 4 show examples in which four light-emitting diode devices are arranged in one light-emitting diode, the number of light-emitting diode devices to be arranged may be smaller or greater than 4 in Embodiments 2 to 5.

Embodiment 6

Figure 25:
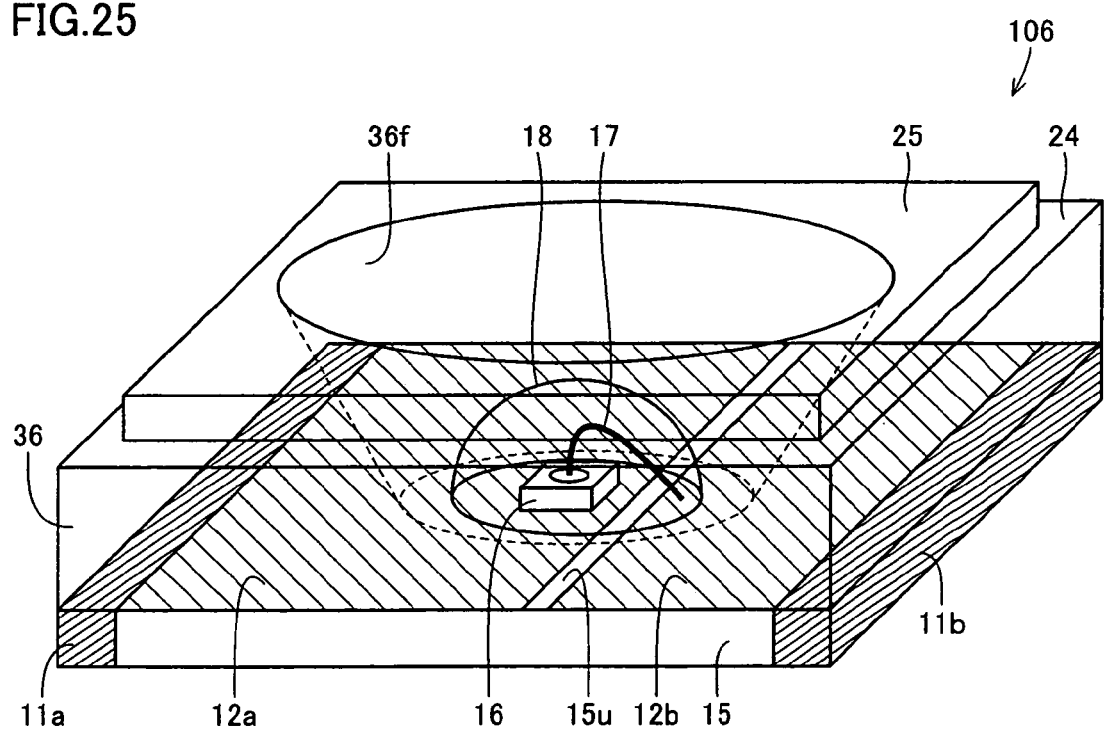
FIG. 25 is a perspective view of a light-emitting diode according to Embodiment 6 of the present invention.
Figure 26:
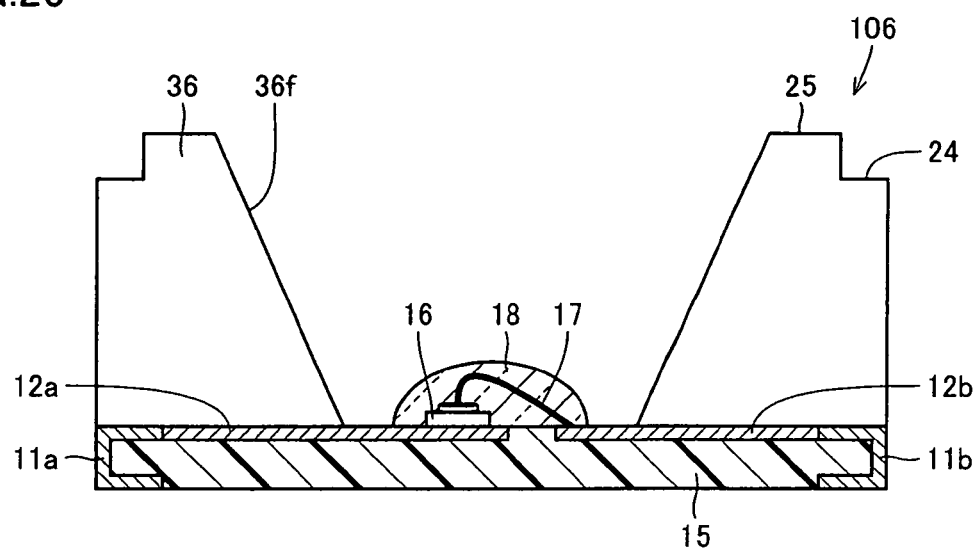
FIG. 26 is a cross-sectional view of the light-emitting diode according to Embodiment 6 of the present invention.
Figure 27:
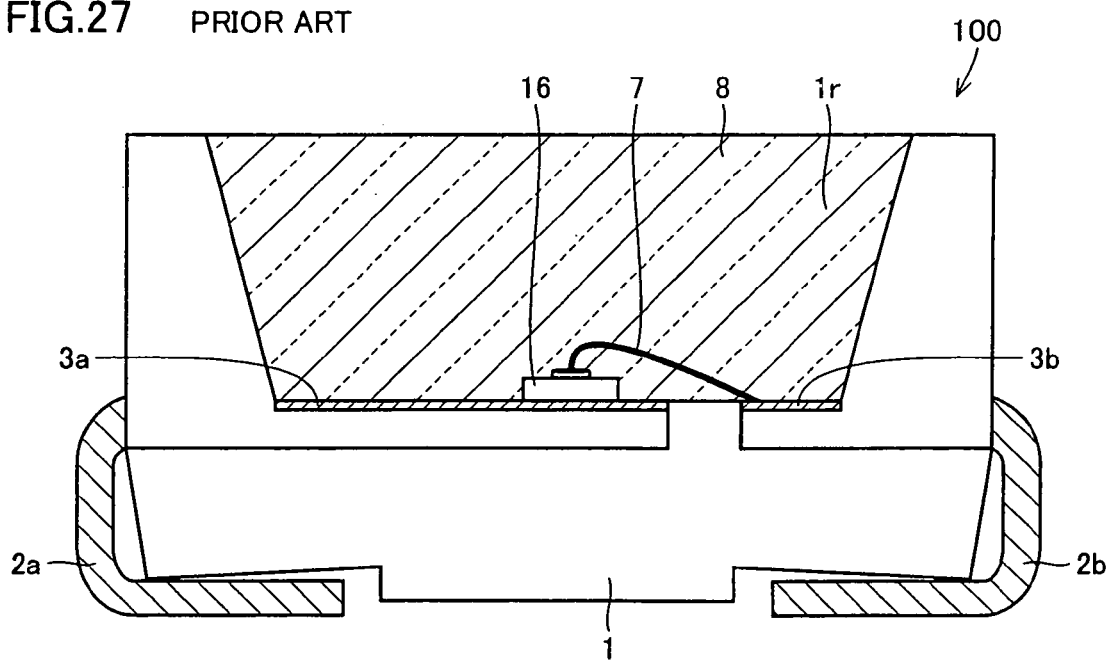
FIG. 27 is a cross-sectional view of a light-emitting diode according to the conventional art.

In each embodiment described above, attention has mainly been paid on the shape of the inner reflection surface of the reflector incorporated in the light-emitting diode. If attention is paid to outer geometry of the reflector, a variation below is also possible. A light-emitting diode according to Embodiment 6 of the present invention will be described with reference to FIGS. 25 and 26. FIGS. 25 and 26 show a perspective view and a cross-sectional view of a light-emitting diode 106, respectively. Light-emitting diode 106 is a variation of light-emitting diode 101 (see FIGS. 1 and 2) shown in Embodiment 1, and includes a reflector 36 instead of reflector 19 of light-emitting diode 101. As shown in FIGS. 25 and 26, reflector 36 has an upper surface 25 extending in parallel to main surface 15u of substrate 15 on the outside of an inclined surface 36f, and a stepped-down portion 24 lower than upper surface 25 that surrounds an outer perimeter of upper surface 25.

In mass-producing the reflector, reflectors are formed in a state of a collective substrate in which a large number of reflectors are arranged in matrix, and thereafter the substrate is divided into individual products by dicing. If plating with a metal film is performed as mirror-finish treatment on the reflector surface, plating is performed on the collective substrate from above prior to division by dicing. In such a case, if the reflector does not have stepped-down portion 24, chipping, that is, fracture, is caused in the metal film on the upper surface during dicing and appearance may be poorer. In the present embodiment, however, stepped-down portion 24 lower than the upper surface is provided, and stepped-down portion 24 is implemented as a groove in the state of the collective substrate. Here, the dicing blade divides the substrate into individual reflectors by cutting through the bottom of the groove. Therefore, even if chipping of the metal film is caused by the dicing blade, chipping remains within stepped-down portion 24 and propagation of chipping to upper surface 25 can be prevented. Poor appearance and peeling of the metal film on the reflection surface can thus be prevented. The stepped-down portion described above is applicable not only to light-emitting diode 101 in Embodiment 1 but also to other light-emitting diodes described so far. If the collective substrate of the reflectors is implemented by arranging the reflectors in matrix, that is, two-dimensionally, the stepped-down portions may preferably be provided on all four sides of the individual reflectors. On the other hand, if the collective substrate of the reflectors is implemented by arranging the reflectors in one row, the stepped-down portions should only be provided on opposing two sides of the individual reflectors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light-emitting diode comprising:
a substrate having a main surface;
a light-emitting diode device arranged on said main surface;
a translucent sealing resin portion sealing said light-emitting diode device so that said light-emitting diode device is implemented as an independent convex portion projecting from said main surface; and
a reflector arranged on said main surface so as to surround an outer perimeter of said sealing resin portion with an inclined surface at a distance from the outer perimeter so that a recessed portion is defined in the reflector and the light-emitting diode is disposed in the recessed portion, wherein the translucent sealing resin portion fills the recessed portion only partially so as to leave at least part of the inclined surface of the reflector exposed, and said inclined surface comprises three portions of different angles of inclination from each other.

2. The light-emitting diode according to claim 1 wherein said inclined surface is implemented by sequential combination of three gradients of approximately 45°, approximately 60° and approximately 70°.

3. The light-emitting diode according to claim 1, wherein said inclined surface is in such a shape that its cross-section is substantially in an arc shape and its gradient is steeper as a distance from said main surface is greater.

4. The light-emitting diode according to claim 1, wherein said reflector has an inner inclined surface subjected to mirror-finish treatment.

5. The light-emitting diode according to claim 4, wherein said mirror-finish treatment is implemented by mirror-finish plating using aluminum or silver.

6. The light-emitting diode according to claim 1, wherein said sealing resin portion is implemented by a transparent resin.

7. The light-emitting diode according to claim 1, wherein said sealing resin portion is implemented by a phosphor-containing resin.

8. The light-emitting diode according to claim 1, wherein said sealing resin portion is implemented by a scatterer-containing resin.

9. The light-emitting diode according to claim 1, wherein said sealing resin portion is substantially in a hemispherical shape.

10. The light-emitting diode according to claim 1, wherein said sealing resin portion is substantially in a columnar shape.

11. The light-emitting diode according to claim 1, wherein said reflector comprises a first upper surface and a second upper surface that are parallel to said main surface, the inclined surface inclines from the first upper surface, and the second upper surface steps down from the first upper surface and is disposed outside said first upper surface.

12. The light-emitting diode according to claim 1, wherein the main surface of the substrate is exposed in the recessed portion of the reflector.

13. A light-emitting diode comprising:
 a substrate comprising a main surface;
 a light-emitting diode device arranged on the main surface;
 a translucent sealing resin portion sealing the light-emitting diode device so that the light-emitting diode device and the translucent sealing resin portion form a convex portion projecting from the main surface; and
 a reflector arranged on the main surface so as to surround an outer perimeter of the sealing resin portion with an inclined surface at a distance from the outer perimeter,
 wherein the reflector comprises a first upper surface and a second upper surface that are parallel to the main surface, the inclined surface inclines from the first upper surface, and the second upper surface steps down from the first upper surface and is disposed outside the first upper surface.

* * * * *